United States Patent
Misra et al.

(10) Patent No.: US 6,399,209 B1
(45) Date of Patent: Jun. 4, 2002

(54) INTEGRATED RELEASE FILMS FOR PHASE-CHANGE INTERFACES

(75) Inventors: Sanjay Misra, Shoreview; Robert E. Kranz, Richfield; Radesh Jewram, Lakeville, all of MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 09/536,419

(22) Filed: Mar. 28, 2000

Related U.S. Application Data

(60) Provisional application No. 60/129,575, filed on Apr. 16, 1999.

(51) Int. Cl.$^7$ .................................................. B22B 9/00
(52) U.S. Cl. .................... 428/447; 428/480; 428/143; 428/484; 428/500; 361/706; 524/404; 524/430; 524/437; 524/588
(58) Field of Search ................................. 428/620, 143, 428/348, 352, 447, 480, 484, 500; 361/706; 524/588, 404, 430, 437

(56) References Cited

U.S. PATENT DOCUMENTS

| | | | |
|---|---|---|---|
| 4,466,483 A | * | 8/1984 | Whitfield et al. |
| 5,950,066 A | | 9/1999 | Hanson et al. |
| 6,054,198 A | * | 4/2000 | Bunyan et al. |
| 6,162,663 A | * | 12/2000 | Schoenstein et al. |
| 6,197,859 B1 | * | 3/2001 | Green et al. |

* cited by examiner

*Primary Examiner*—Margaret G. Moore
*Assistant Examiner*—Marc S. Zimmer
(74) *Attorney, Agent, or Firm*—Haugen Law Firm PLLP

(57) ABSTRACT

A thermally conductive conformable interface pad for interposition between a heat generating solid state electronic device and a heat sinking surface. The interface comprises a laminate of at least two layers, including a relatively soft conformable body layer with at least one surface consisting of an integrally bonded anti-blocking layer. The conformable body layer preferably comprises a thermally stable wax consisting of an alkyl substituted poly (hydro, methyl-siloxane) wax and a thermally conductive particulate solid, while the anti-blocking layer may comprise a mixture of an alkyl substituted poly (hydro, methyl-siloxane) wax and a silicone wax, a glassy polyester layer, or a cross-linked acrylic layer.

11 Claims, 1 Drawing Sheet

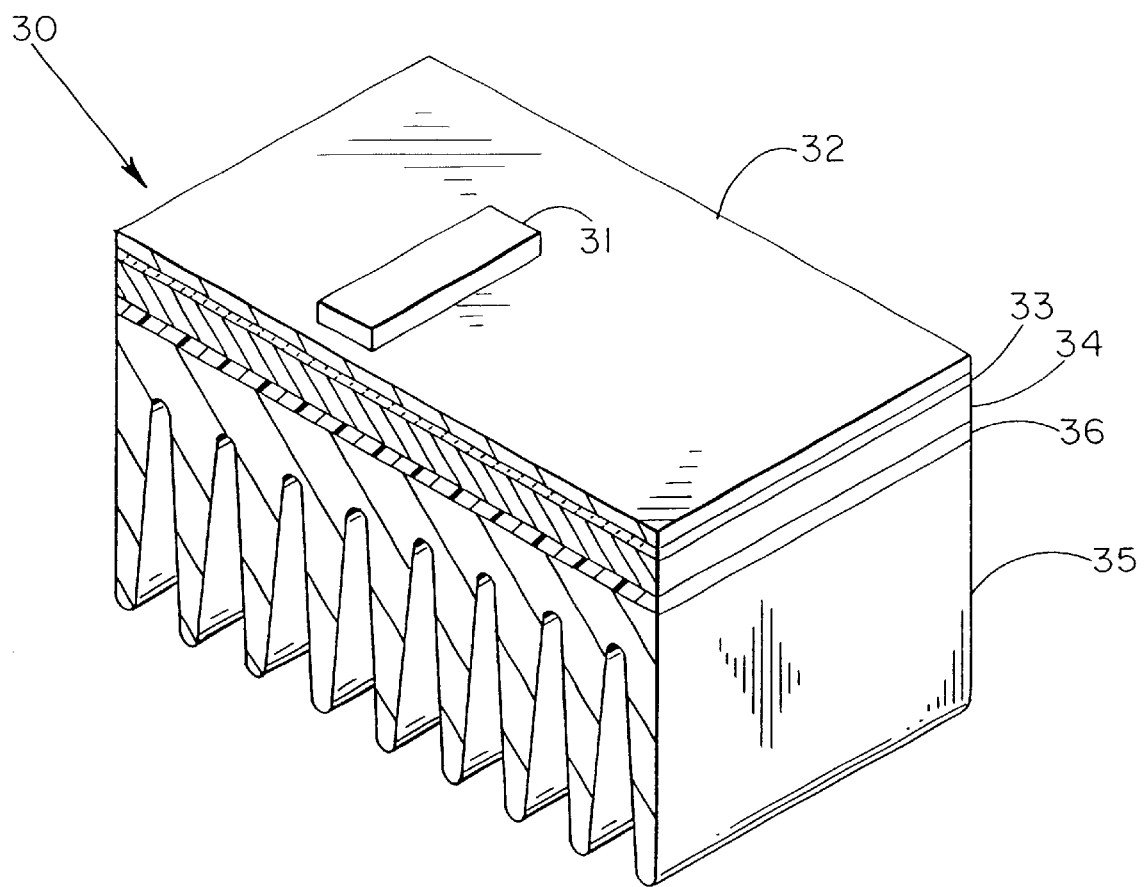

INTEGRATED RELEASE FILMS FOR PHASE-CHANGE INTERFACES

CROSS-REFERENCE TO RELATED APPLICATION

This application relates to that certain Provisional application Ser. No. 60/129,575, filed Apr. 16, 1999, entitled "COMPOSITE CONFORMABLE FLEXIBLE MEMBER WITH HARD ANTI-BLOCKING SURFACE". The subject matter of this application further relates to discoveries disclosed in application Ser. No. 09/016,768, filed Jan. 30, 1998, entitled "THERMAL INTERFACES FOR ELECTRONIC DEVICES", now U.S. Pat. No. 6,197,859, as well as that disclosed and claimed in application Ser. No. 08/663, 800, filed Jun. 14, 1996, entitled "SEMISOLID THERMAL INTERFACE WITH LOW FLOW RESISTANCE", now U.S. Pat. No. 5,950,066, issued Sep. 7, 1999; all of which are assigned to the assignee of the present invention.

BACKGROUND OF THE INVENTION

The present invention relates generally to a composite interface pad or coating for use in combination with heat generating semiconductor devices, and more particularly to a composite conformable member consisting of a base thermally conductive layer having an integral and compatible anti-blocking layer (hereinafter sometimes referred to as "lacquer") formed on an outer surface thereof. In addition to the anti-blocking properties which are important to a user prior to placement of the material in an operative assembly, this outer non-tacky release layer serves to provide significant protection for the base component against surface contamination. In addition, the anti-blocking properties may allow the electronic assembly to be "reworked"—i.e. disassembled and reassembled without the need to change the thermal interface pad. At the same time, the thermal and mechanical properties of the underlying bulk layer are not adversely affected, and remain present in the hard coated composite product. In use, the conformable composite is positioned between the opposed surfaces of a semiconductor device and a chassis or heat spreader, and accordingly becomes subjected to the elevated temperatures created and experienced by the semiconductor device during its normal operation and function.

The conformable composite member with its release surface nevertheless serves to enhance heat transfer through the elimination of voids or entrapped air which may otherwise be present along any irregular configurations formed in the opposed surfaces of the semiconductor device and chassis or heat spreader. The anti-blocking layer on the surface of the thermally conductive base layer eliminates the need for a liner film of the type which has heretofore been utilized as a protective layer and to accomplish or assist in anti-blocking. Thus, use of the conformable composite of the present invention serves to eliminate one or more significant labor-intensive operations, namely the elimination of the need to physically remove the liner film from the surface of a conformable thermally interface conductive member. Because the release surface layer is quite thin, it does not detract from the ability of the entire pad or layer to conform to the configuration of the surfaces of the members between which it is interposed.

Once it has served its purpose, the liner film must be removed prior to the point in time when it is placed into contact with the semiconductor device. This removal operation has frequently proven to be bothersome, and always time consuming and labor intensive. Hence this becomes a significant factor in the overall cost of assembly. The features of the present invention eliminate the need for the liner film, while at the same time the integrity and thermal properties of the thermally conductive composite are preserved. Depending upon the intended application for the composite, it may nevertheless be necessary to apply a liner film or tape to one surface, but not to both. Normally, when two liner films are employed, they are each removed at different points in time. In this connection, when a single liner film is used, the thin anti-blocking layer will be applied to the surface without the liner film or tape.

The present invention may also provide the ability for the electronic assembly to be disassembled and repaired without the need for replacing the phase change interface pad, since the anti-blocking layer will allow heat transfer surfaces to separate cleanly and to be reassembled.

The base or bulk portion of the composite interface upon which the release surface is applied is preferably of the phase-change type. The formulation normally comprises a blend of a microcrystalline wax, with alumina particulate being added to the wax to enhance thermal conductivity. Silicone wax may be added to the formulation for the base portion, if desired. The microcrystalline wax preferably has a melting point in the range of between about 40° C. and 80° C. In order to improve the wettability of the alumina particulate in the wax matrix, a quantity of an alkyl silane, such as for example octyl- or methyl-triethoxy silane may be utilized. This formulation is then employed to form the phase-change component forming the base or bulk portion of the composite. Other formulations useful in creating the base portion of the interface include those disclosed in application Ser. No. 09/016,768, filed Jan. 30, 1998, entitled "THERMAL INTERFACES FOR ELECTRONIC DEVICES", as well as in application Ser. No. 08/663,800, filed Jun. 14, 1996, entitled "SEMISOLID THERMAL INTERFACE WITH LOW FLOW RESISTANCE", now U.S. Pat. No. 5,950,066, both of which application and patent are assigned to the assignee of the present invention. Their disclosures are incorporated herein by reference.

The phase change portion of the conformable composite becomes at least partially liquid at temperatures encountered during normal operation of the solid state or semiconductor device with which it is being used. The phase change conformable composites of the present invention provide a highly thermally conductive path for dissipation of thermal energy and are effective independent of their immediate phase. The conformable composites find application on the surfaces upon which the semiconductor device is either being directly mounted, or alternatively, to which the device is being otherwise operatively thermally coupled. They may be applied as required onto surfaces of either metallic or polymeric materials. These conformable composites are preferably die-cut, although other operations may be employed.

Solid state electronic devices or components are incorporated in electronic systems generally, including systems used in the fields of data processing, communications, power supply systems, among others. Solid state electronic devices including power transistors, power modules including converts such as AC-to-DC and DC-to-DC and other similar components. The terms "semiconductor device" and "solid state electronic devices" are being used herein in a comprehensive sense, and are intended to include solid state circuits wherein a complete circuit is formed from a single block or chip of semiconductor material, solid state circuit elements such as Zener diodes, silicone controlled rectifiers, as well as other solid state components such as transistors and diodes.

Other devices falling within the comprehensive meaning of the terms include passive components, thermoelectric devices, as well as lasers, each of which typically require contact with a heat exchanger or a thermally conductive path for heat dissipation. These devices are typically incorporated in packages designed for mounting on a chassis in accordance with the individual requirements of the specific circuit. As power and frequency requirements increase, and as the space available for these devices or components shrink, these packages typically require highly efficient, effective, and reliable means for dissipating heat created by the solid state electronic devices during periods of normal operation. Heat is typically transferred by thermal conduction from the package to a mounting surface. This thermal conduction may be undertaken either directly, as occurs when the device is mounted upon the heat dissipating surface, or indirectly as occurs when the device is mounted to a surface which is arranged along a more extensive thermal path leading to a heat dissipating member such as a heat sink or chassis.

In the past, during assembly, it has been common to apply a layer of grease, typically a silicone grease, or a layer of an organic wax to aid in creating a low thermal resistance path between the opposed mating surfaces of the package and the mounting surface. A layer of such grease is typically applied between these mating surfaces in order to displace air and facilitate and enhance thermal conductivity. The devices of the present invention provide significant advantages over the utilization of silicone grease particularly in production and assembly operations.

SUMMARY OF THE INVENTION

In accordance with the present invention, therefore, a conformable composite thermally conductive member with a thin surface release layer, e.g., a thin lacquer film thereon is provided for use as an interface for mounting semiconductor devices. This composite, including its release or lacquer surface functions to enhance thermal transfer from the semiconductor or its heat sink to a chassis or the like. When employed in an actual circuit arrangement, assembly time is shortened, and the overall operation is simplified due to the elimination of the need for a liner film. Thereafter, and during normal operation of the semiconductor device, the entire conformable composite member will undergo a phase change, becoming partially molten, thereby enhancing the ability of the overall composite to effectively transfer thermal energy from the device to its mounting chassis. The release layer can be formulated such that it may also melt during operation or remain intact, particularly when the ability to rework the assembly is desired. In addition to being highly thermally conductive, the conformable composites are dimensionally stable, but possess flow characteristics permitting them to respond by fluxing or compressing upon application of only low to modest unit forces and pressures. Because of this property, the conformable composites are highly useful and effective when the delicate nature of the semiconductor package allows exposure to only extremely modest or small external forces. Since some of these products are necessarily exposed to these low or modest forces during assembly, the composites of the present invention will always flow to conform to the configuration of the opposed mating surfaces involved.

Briefly, the composite of the present invention comprises a thermally conductive base or bulk layer of a microcrystalline wax to which a quantity of alumina or other thermally conductive particulate has been added. A thin release layer which may be designated as a lacquer, is applied to the surface in order to form a protective surface or barrier thereon. A variety of hard-non-tacky layers may be found to be useful, including a blend of a silicone and microcrystalline waxes, glassy polyester layer (preferably blended with thermally conductive particulate such as graphite, boron nitride, alumina, and the like)or cross-linked acrylic-based layers. It is preferably compatible with the bulk portion of thermally conductive layer for maximum heat transfer. In use, the lacquer may become merged with or amalgamated into the thermally conductive base layer, with such merger or amalgamation not adversely affecting either the thermal or mechanical properties of the composite, including its thermal stability. If rework properties are desired, the lacquer is formulated such that it retains its integrity while the base layer becomes molten, thus allowing the assembly components to be removed easily.

The term "lacquer" is used herein in a comprehensive sense, and is intended to define a surface which is somewhat harder than the bulk of the thermally conductive layer which it covers. As set forth above, it is this lacquer layer which performs the function of the anti-blocking liner film traditionally used in the past.

Therefore, it is a primary object of the present invention to provide an improved composite conformable phase change member with an anti-blocking surface, and which is adapted for use as an interface positioned between a semiconductor device and a heat dissipating surface.

It is a further object of the present invention to provide an improved conformable composite member comprising a base layer of high thermal conductivity, together with an integral, compatible outer anti-blocking film or coating thereon to provide surface protection, with the outer film also being highly thermally conductive.

It is a further object of the present invention to provide an improved conformable composite member comprising a base layer of high thermal conductivity, together with an integral, compatible outer anti-blocking film or coating thereon to provide for easy disassembly and reassembly of the electronic package without necessitating the replacement of the phase change pad.

Other and further objects of the present invention will become apparent to those skilled in the art upon a study of the following specification, appended claims, and accompanying drawings.

IN THE DRAWINGS

The figure is a perspective view of a packaged solid state electronic device mounted directly onto a circuit board which comprises one portion of a thermal path leading to a heat sink, wherein a heat spreader is positioned at an intermediate point along the path, wherein the composite of the present invention is interposed between the surfaces of the heat spreader and heat sink.

DESCRIPTION OF THE PREFERRED EMBODIMENT

In accordance with the present invention, a phase change conformable composite member is formed consisting of a thermally conductive layer or coating having an integral and compatible outer anti-blocking film or layer thereon, and wherein the formulations are set forth in the following examples.

(A) THE HARDENED COATING COMPONENT:

Examples I–VII are of the type where the hard coat or lacquer melts along with the base layer providing for maximum heat transfer. Examples VIII–IX refer to a lacquer layer that allows for reworkability.

EXAMPLE I

A blend of a microcrystalline wax and silicone wax is formed as follows:

| Component | Parts by Weight | Grams |
|---|---|---|
| Microcrystalline wax (melting point 55° C.) | 100 phr | 5 |
| Alkyl-substituted poly (hydro, methyl-siloxane) wax (melting point 65° C.) | 500 phr | 25 |
| Alumina particulate (up to 5 micron particle size) | 2400 phr | 120 |
| methyl-triethoxysilane, in the amount of one-half part to 100 parts by weight of alumina particulate | | 0.6. |

EXAMPLE II

The following formulation was initially prepared for the conformable body layer:

| Component | Weight | Percent by Weight |
|---|---|---|
| Alkyl substituted poly (hydro, methyl-siloxane) wax | 5.8 grams | 29% |
| Ethylene vinyl acetate | 2.2 grams | 11% |
| Alumina, up to 5 micron particle size | 12 grams | 60%. |

EXAMPLE III

A blend of a microcrystalline wax and silicone wax is formed as follows:

| Component | Parts by Weight | Grams |
|---|---|---|
| Microcrystalline wax (melting point 55° C.) | 100 phr | 10 |
| Alkyl-substituted poly (hydro, methyl (melting point 65° C.) | 250 phr | 25 |
| Alumina particulate (up to 5 micron particle size) | 1900 phr | 190 |
| and methyl-triethoxysilane, the silane being present in the amount of one-half part to 100 parts by weight of alumina particulate | | 0.8. |

EXAMPLE IV

A blend of a microcrystalline wax and silicone wax is formed as follows:

| Component | Parts by Weight | Grams |
|---|---|---|
| Microcrystalline wax (melting point 55° C.) | 100 phr | 15 |
| Alkyl-substituted poly (hydro, methyl-siloxane) wax (melting point 65° C.) | 167 phr | 25 |
| Alumina particulate (up to 5 micron particle size) | 1070 phr | 160 |
| and methyl-triethoxysilane, the silane being present in the amount of one-half part to 100 parts by weight of alumina particulate | | 0.8. |

EXAMPLE V

A blend of a microcrystalline wax and silicone wax is formed as follows:

| Component | Parts by Weight | Grams |
|---|---|---|
| Microcrystalline wax (melting point 55° C.) | 100 phr | 25 |
| Alkyl-substituted poly (hydro, methyl-siloxane) wax (melting point 65° C.) | 100 phr | 25 |
| Alumina particulate (up to 5 micron particle size) | 800 phr | 160 |
| and methyl-triethoxysilane, the silane being present in the amount of one-half part to 100 parts by weight of alumina particulate | | 1. |

EXAMPLE VI

A blend of a microcrystalline wax and silicone wax is formed as follows:

| Component | Parts by Weight | Grams |
|---|---|---|
| Microcrystalline wax (melting point 55° C.) | 100 phr | 30 |
| Alkyl-substituted poly (hydro, methyl-siloxane) wax (melting point 65° C.) | 33 phr | 10 |
| Alumina particulate (up to 5 micron particle size) | 533 phr | 160 |
| and methyl-triethoxysilane, the silane being present in the amount of one-half part to 100 parts by weight of alumina particulate | | 0.8. |

EXAMPLE VII

A blend of microcrystalline wax and silicone wax is formed as follows:

| Component | Parts by Weight |
|---|---|
| Alkyl-substituted poly (hydro, methylsiloxane) wax (melting point 65° C.) | 60 lbs. |
| Microcrystalline wax (melting point 55° C.) | 40 lbs. |
| Alumina particulate (up to 5 micron particle size) | 400 lbs. |
| and methyl-triethoxysilane, the silane being present in the amount of one-half part to 100 parts by weight of alumina particulate | 2 lbs. |
| A dye may be added to this formulation as follows: | |
| Sunfast Blue (0.35 phr. of total solids) | 1.75 lbs. |
| Silane | 3.00 lbs. |

EXAMPLE VIII

A polyester resin blend is formed as follows:

| Component | Parts by Weight |
|---|---|
| Polyester Resin (Glass transition 70° C.) | 100 lbs. |
| Boron Nitride Particulate (5–10 micron particle size) | 40 lbs. |

EXAMPLE IX

A polyester resin blend is formed as follows:

| Component | Parts by Weight |
|---|---|
| Polyester Resin (Glass transition 70° C.) | 100 lbs. |
| Graphite Particulate (1–10 micron particle size) | 70 lbs. |

(B) THE BULK COMPONENT

A blend of a microcrystalline wax and alumina is formed as follows:

| Component | Parts by Weight |
|---|---|
| Microcrystalline wax (melting point 55° C.) | 100 lbs. |
| Alumina particulate (up to 5 micron particle size with methyl-triethoxysilane, one-half part per 100 parts alumina particulate) | 600 lbs |
| A dye may be added to this formulation as follows: | |
| Sunfast Blue (0.35 phr. of total solids) | 1.75 lbs. |

The materials employed and set forth in the above examples are all commercially available pursuant to the following:

Alumina particulate under the trade designation "SG-3500" is available from Alcoa, of Pittsburgh, Pa.

Microcrystalline wax (melting point of 55° C.) is available under the designation "M-7332" from Moore and Munger Co. of Hartford, Conn.

Poly (hydrogen methyl siloxane) wax (melting point of 65° C.) is available under the trade designation "Tegropen 6846" from Goldschmidt Co. of Germany.

Polyester resin (glass transition of 70° C.) is available under the trade designation "Bostik 7237" from Bostik Corporation of Middleton, Mass.

Boron nitride is available under the trade designation "AC-60471 " from Advanced Ceramics Corporation of Cleveland, Ohio.

Graphite is available under the trade designation "Grade 38" from Union Carbide Danbury, Conn.

Methyl-triethoxysilane is available commercially.

Prior to blending, and in the examples given above, the methyl-triethoxysilane is present in the blend, having been added to the alumina in the amount of one-half part silane to each 100 parts of alumina. In each of the examples, silane is present with the alumina particulate in the amount of one-half part to 100 parts of alumina. It has been found that the silane is effective when added in an amount of between about one-quarter part to two parts per hundred by weight of alumina.

C. FORMATION OF THE COMPOSITE

The base or bulk layer is formed from the blend, preferably with a thickness of about 120 microns. Other thicknesses such as in the range of between about 100 and 120 microns may also be advantageously employed. The outer film is relatively thin, having a thickness ranging from between about 5 microns and 25 microns, with a thickness of about 15 microns having been found to be desirable. In addition, if desired, a "reinforcing" layer, preferably a thin aluminum foil (0.5–3 mils thick), may be employed between the base layer and the lacquer layer, providing improved handling and release properties for certain applications. Utilizing these parameters, the composite is prepared and formed to a desired configuration for its ultimate application and use.

D. USE OF THE COMPOSITE

With attention being directed to the drawing, it will be observed that the assembly generally designated 30 comprises a semiconductor device 31 arranged at the upper surface of conductive circuit layer 32, with dielectric layer 33 supporting conductive layer 32. For most purposes, dielectric layer 33 is fabricated from a suitable thermally conducting dielectric, such as, for example, any of the well-known thermally conductive ceramic dielectrics. A metal heat spreader is interposed along the thermal path leading away from the semiconductor as at 34, with the thermal path ultimately leading to heat sink 35. The coating material of the present invention is shown at 36, interposed between the surfaces of heat spreader 34 and heat sink 35. In this arrangement, the heat from semiconductor device 31, along with any other heat generating devices positioned along the surface of conductive layer 32, will dissipate heat along the thermal path leading to and terminating with heat sink 35.

The thermally stable wax component preferably comprises an alkyl substituted poly (hydro, methyl-siloxane) wax having a melting point or phase-change between about 40° C. and 90° C., and more preferably between about 45° C. and 65° C. A preferred melting range is about 65° C.

In certain formulations, a flexibilizer component may be utilized with the microcrystalline wax in the bulk or body layer. Such flexibilizer components may be selected from the group consisting of ethylene vinyl acetate, styrenic thermoplastic elastomers consisting of block copolymers of styrene-ethylene-butylene-styrene and polyvinylbutyral, each present in an amount of between about 5% and 15%.

A plasticizer component may also be utilized in the bulk layer, with the plasticizer being selected from the group consisting of short chain polystyrene; short chain hydrocarbons; and penta-erythritol esters of wood rosin present in an amount of up to about 10%.

A thermally conductive component is preferably alumina, but may be selected from the group consisting of alumina, boron nitride, graphite, silicon carbide, diamond, metallic powders, and mixtures thereof, with the particulate having an average particle size of up to about 5 microns and present in the amount of from between about 45% and 76%.

What is claimed is:

1. A thermally conductive conformable interface pad for inter-position along the heat dissipating path between a solid state electronic device and heat sinking surface, and comprising a laminate with a relatively soft conformable body layer having opposed major surfaces and with at least one major surface consisting of an integrally bonded anti-blocking layer, said laminate being characterized in that:

(a) said conformable body layer comprises a blend of microcrystalline wax, an alkyl substituted poly (hydro, methyl-siloxane) wax, and a thermally conductive particulate solid, the particulate solid having a particle size of up to about 10 microns, wherein said microcrystalline wax and said alkyl substituted poly (hydro, methyl-siloxane) wax components, in combination, are present in said blend in the amount of between about 18% and 55% by weight, balance thermally conductive particulate solids; and (b) said integrally bonded anti-blocking layer being a resinous material selected from the group consisting of a mixture of an alkyl substituted poly (hydro, methyl-siloxane) wax and a microcrystalline wax; a mixture of a glassy polyester layer with a glass transition temperature of at least about 70° C.; and a mixture of a cross-linked acrylic.

2. A thermally conductive conformable interface pad for inter-position along the heat dissipating path between a solid state electronic device and heat sinking surface, and comprising a laminate with a relatively soft conformable body layer having opposed major surfaces and with at least one major surface consisting of an integrally bonded anti-blocking layer, said laminate being characterized in that:

(a) said conformable body layer comprises a blend of a microcrystalline wax, an alkyl substituted poly (hydro, methyl-siloxane) wax, and a thermally conductive particulate solid, the particulate solid having a particle size of up to about 10 microns, wherein said microcrystalline wax and said alkyl substituted poly (hydro, methyl-siloxane) wax components, in combination, are present in said blend in the amount of between about 18 and 55 by weight, balance thermally conductive particulate solids; and (b) said integrally bonded anti-blocking layer comprises a mixture of an alkyl substituted poly (hydro, methyl-siloxane) wax and a microcrystalline wax with said mixture being blended with a thermally conductive particulate solid, and wherein said microcrystalline wax has a melting point which is about 10° C. greater than that of said alkyl substituted poly (hydro, methyl-siloxane) wax, and wherein said thermally conductive particulate solid has a size of up to 5 microns and comprises between 75% and 85% of said blend, balance alkyl substituted poly (hydro, methyl-siloxane) wax/microcrystalline wax mixture.

3. A thermally conductive conformable interface pad for inter-position along the heat dissipating path between a solid state electronic device and heat sinking surface, and comprising a laminate with a relatively soft conformable body layer having opposed major surfaces and with at least one major surface consisting of an integrally bonded anti-blocking layer, said laminate being characterized in that:

(a) said conformable body layer comprises a microcrystalline wax, an alkyl substituted poly (hydro, methyl-siloxane) wax, and a thermally conductive particulate solid, the particulate solid having a particle size of up to about 10 microns, wherein said wax components, in combination, are present in said blend in the amount of between about 18% and 55% by weight, balance thermally conductive particulate solids; and (b) said integrally bonded anti-blocking layer comprises a mixture of a glassy polyester layer, preferably with glass transition temperature of 70° C. or higher and being blended with thermally conductive fillers selected from the group consisting of alumina, boron nitride and graphite in order to impart it a thermal conductivity of 1–4 $W-m^{-1}-K^{-1}$.

4. A thermally conductive conformable interface pad for inter-position along the heat dissipating path between a solid state electronic device and heat sinking surface, and comprising a laminate with a relatively soft conformable body layer having opposed major surfaces and with at least one major surface consisting of an integrally bonded anti-blocking layer, said laminate being characterized in that:

(a) said conformable body layer comprises a thermally stable wax consisting of a microcrystalline wax, an alkyl substituted poly (hydro, methyl-siloxane) wax, and a thermally conductive particulate solid, the particulate solid having a particle size of up to about 10 microns, wherein said microcrystalline wax and said alkyl substituted poly (hydro, methyl-siloxane) wax components, in combination, are present in said blend in the amount of between about 18% to 55% by weight, balance thermally conductive particulate solids; and (b) said integrally bonded anti-blocking layer comprises a mixture of a cross-linked acrylic layer blended with thermally conductive fillers selected from the group consisting of alumina, boron nitride and graphite in order to impart it a thermal conductivity of 1–4 $W-m^{-1}-K^{-1}$.

5. The interface pad of claim 1 wherein said conformable interface pad further comprising a layer of aluminum foil interposed between said base layer and said anti-blocking layer, wherein the aluminum foil has a thickness ranging from between about 0.5 and 2 mils.

6. The interface pad of claim 1 being particularly characterized in that said microcrystalline wax in said conformable body layer comprises between about 10 and 20 parts per hundred weight of thermally conductive particulate.

7. The interface pad of claim 6 being particularly characterized in that said microcrystalline wax in said conformable body layer comprises 100 parts per 600 parts by weight of thermally conductive particulate.

8. The interface pad of claim 1 being particularly characterized in that the conformable body layer includes a flexibilizer component selected from the group consisting of ethylene vinyl acetate, styrenic thermoplastic elastomers consisting of block copolymers of styrene-ethylene-butylene-styrene and polyvinylbutyral present in an amount of between about 5% and 10% by weight.

9. The interface pad of claim 2 being particularly characterized in that the conformable body layer contains a plasticizer component selected from the group consisting of short chain polystyrene; short chain hydrocarbons; and penta-erythritol esters of wood rosin present in an amount of between about 10% and 15%.

10. The interface pad of claim 2 wherein the integrally bonded anti-block layer consists of a mixture of microcrystalline and alkyl substituted poly (hydro, methyl-siloxane) wax, and wherein the ratio of alkyl substituted poly (hydro, methyl-siloxane) wax to microcrystalline wax is between about 3:1 and 1:5, and wherein said integrally bonded anti-block layer has a melting point which is in the range of about 10° C. greater than the melting point of said conformable body layer.

11. The interface pad of claim 10 wherein the conformable body layer has a melting point of about 55° C. and said anti-block layer has a melting point of about 65° C.

* * * * *